United States Patent
Ng

(10) Patent No.: US 8,085,604 B2
(45) Date of Patent: Dec. 27, 2011

(54) SNAP-BACK TOLERANT INTEGRATED CIRCUITS

(75) Inventor: Philip S. Ng, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 404 days.

(21) Appl. No.: 12/334,155

(22) Filed: Dec. 12, 2008

(65) Prior Publication Data

US 2010/0149710 A1   Jun. 17, 2010

(51) Int. Cl.
*G11C 7/00* (2006.01)
(52) U.S. Cl. .............................. 365/189.11; 365/189.05
(58) Field of Classification Search ............. 365/189.11, 365/189.09; 326/39
See application file for complete search history.

(56) References Cited

U.S. PATENT DOCUMENTS

| | | | |
|---|---|---|---|
| 4,487,639 A | 12/1984 | Lam et al. | |
| 4,551,743 A | 11/1985 | Murakami | |
| 4,683,637 A | 8/1987 | Varker et al. | |
| 4,769,687 A | 9/1988 | Nakazato et al. | |
| 4,992,843 A | 2/1991 | Blossfeld et al. | |
| 5,043,778 A | 8/1991 | Teng et al. | |
| 5,086,322 A | 2/1992 | Ishii et al. | |
| 5,148,164 A * | 9/1992 | Nakamura et al. | 341/136 |
| 5,258,642 A | 11/1993 | Nakamura | |
| 5,391,907 A | 2/1995 | Jang | |
| 5,436,183 A | 7/1995 | Davis et al. | |
| 5,473,500 A | 12/1995 | Payne et al. | |
| 5,565,375 A | 10/1996 | Hiser et al. | |
| 5,581,104 A | 12/1996 | Lowrey et al. | |
| 5,726,562 A | 3/1998 | Mizuno | |
| 5,767,552 A | 6/1998 | Casper et al. | |
| 5,780,897 A | 7/1998 | Krakauer | |
| 5,814,865 A | 9/1998 | Duvvury et al. | |
| 5,834,793 A | 11/1998 | Shibata | |
| 5,847,429 A | 12/1998 | Lien et al. | |
| 5,852,375 A | 12/1998 | Byrne et al. | |
| 5,852,540 A | 12/1998 | Haider | |
| RE36,024 E | 1/1999 | Ho et al. | |
| 5,877,046 A | 3/1999 | Yu et al. | |
| 5,880,917 A | 3/1999 | Casper et al. | |
| 5,930,094 A | 7/1999 | Amerasekera et al. | |
| 5,949,254 A | 9/1999 | Keeth | |
| 5,956,598 A | 9/1999 | Huang et al. | |
| 5,982,599 A | 11/1999 | Ma et al. | |
| 5,986,867 A | 11/1999 | Duvvury et al. | |

(Continued)

OTHER PUBLICATIONS

"U.S. Appl. No. 11/870,322, Non-Final Office Action mailed Apr. 6, 2009", 6 pgs.

(Continued)

*Primary Examiner* — Son Dinh
(74) *Attorney, Agent, or Firm* — Fish & Richardson P.C.

(57) ABSTRACT

A method and a circuit for preventing snap-back current in NMOS transistors of MOS integrated circuits are provided. Example embodiments may include preventing snap-back current in a circuit including a first NMOS transistor having an associated parasitic bipolar transistor. A second NMOS transistor may be connected in series with the first NMOS transistor. A gate node of the second NMOS transistor may be coupled to a bias node, such that the second NMOS transistor in conductive (ON) state. An auxiliary circuit coupled to a source node of the first NMOS transistor may be configured to provide a bias potential at the source node of the first NMOS transistor, when the first NMOS transistor is in a non-conducting state (OFF).

14 Claims, 6 Drawing Sheets

U.S. PATENT DOCUMENTS

| | | | |
|---|---|---|---|
| 6,013,936 A | | 1/2000 | Colt, Jr. |
| 6,025,736 A | * | 2/2000 | Vora et al. .................. 326/39 |
| 6,069,610 A | | 5/2000 | Denda |
| 6,091,594 A | | 7/2000 | Williamson et al. |
| 6,096,610 A | | 8/2000 | Alavi et al. |
| 6,104,589 A | | 8/2000 | Williamson |
| 6,118,323 A | | 9/2000 | Chaine et al. |
| 6,130,811 A | | 10/2000 | Gans et al. |
| 6,137,338 A | | 10/2000 | Marum et al. |
| 6,140,682 A | | 10/2000 | Liu et al. |
| 6,147,538 A | | 11/2000 | Andresen et al. |
| 6,181,540 B1 | | 1/2001 | Schoenfeld et al. |
| 6,194,764 B1 | | 2/2001 | Gossner et al. |
| 6,204,537 B1 | | 3/2001 | Ma |
| 6,246,094 B1 | | 6/2001 | Wong et al. |
| 6,271,566 B1 | | 8/2001 | Tsuchiaki |
| 6,285,213 B1 | | 9/2001 | Makino |
| 6,310,379 B1 | | 10/2001 | Andresen et al. |
| 6,331,469 B1 | | 12/2001 | Park et al. |
| 6,344,669 B1 | | 2/2002 | Pan |
| 6,346,729 B1 | | 2/2002 | Liang et al. |
| 6,399,973 B1 | | 6/2002 | Roberds |
| 6,465,852 B1 | | 10/2002 | Ju |
| 6,466,423 B1 | | 10/2002 | Yu |
| 6,515,344 B1 | | 2/2003 | Wollesen |
| 6,700,151 B2 | | 3/2004 | Peng |
| 6,713,993 B2 | | 3/2004 | Descombes |
| 6,809,386 B2 | | 10/2004 | Chaine et al. |
| 6,826,026 B2 | | 11/2004 | Duvvury et al. |
| 6,847,235 B2 | | 1/2005 | Graves |
| 6,958,518 B2 | | 10/2005 | Wylie |
| 7,215,188 B2 | | 5/2007 | Ramaraju et al. |
| 7,253,064 B2 | | 8/2007 | Chaine et al. |
| 2002/0142552 A1 | | 10/2002 | Wu |
| 2005/0275055 A1 | | 12/2005 | Parthasarathy et al. |
| 2008/0019064 A1 | | 1/2008 | Chaine et al. |
| 2009/0096501 A1 | | 4/2009 | Ng et al. |

OTHER PUBLICATIONS

"U.S. Appl. No. 11/870,322, Response filed Jul. 31, 2009 to Non Final Office Action mailed Apr. 6, 2009", 6 pgs.

"U.S. Appl. No. 11/870,322, Notice of Allowance mailed Nov. 19, 2009", 4 pgs.

Anderson, W. et al., "ESD protection for mixed-voltage I/O using NMOS transistors stacked in a cascade configuration", IEEE Electrical Overstress/Electrostatic Discharge Symposium Proceedings 1998, pp. 54-62.

Wolf, S., Silicon Processing for the VLSI Era, vol. 2: Process Integration, Lattice Press, CA, 1990, pp. 45-58.

\* cited by examiner

US 8,085,604 B2

SNAP-BACK TOLERANT INTEGRATED CIRCUITS

TECHNICAL FIELD

Example embodiments relate generally to the technical field of microelectronics and their manufacture.

BACKGROUND

As the integrated circuit manufacturing technology advances, device feature sizes shrink and the number of transistors that can be integrated on a single die grows exponentially. Associated with the decreasing feature sizes are benefits as well as complexities. Some of the complexities are related to breakdown in reversed bias junctions at sufficiently high voltages. For example, programming some memory devices currently involves high voltages which may exceed the breakdown voltage of gate-drain junction of MOS transistors.

The breakdown may result in a damaging leakage current passing through the device when the device is expected to be in non-conducting (OFF) state. The breakdown effect is deemed to be exacerbated as the feature sizes decrease, even when the applied high voltages are unchanged.

BRIEF DESCRIPTION OF THE DRAWINGS

Some embodiments are illustrated by way of example and not limitation in the figures of the accompanying drawings in which.

DETAILED DESCRIPTION

Example methods and circuits for current mode data sensing and propagation by using voltage amplifier will be described. In the following description, for purposes of explanation, numerous examples having example-specific details are set forth in order to provide a thorough understanding of example embodiments. It will be evident, however, to one skilled in the art that the present examples may be practiced without these example-specific details.

Some example embodiments described herein may include a method and a circuit for preventing snap-back current in N-channel MOS (NMOS) transistors of integrated circuits. Example embodiments may include preventing snap-back current in a circuit including a first NMOS transistor having an associated parasitic bipolar transistor. A second NMOS transistor may be connected in series with the first NMOS transistor. A gate node of the second NMOS transistor may be coupled to a bias node, such that the second NMOS transistor is in conductive (ON) state.

An auxiliary circuit coupled to a source node of the first NMOS transistor may be configured to provide a bias potential at the source of the first NMOS transistor, when the first NMOS transistor is in non-conducting state (OFF). The bias potential may prevent the associated parasitic bipolar transistor from turning on, therefore reducing the chance of snap-back in the first NMOS transistor.

Figure 1:
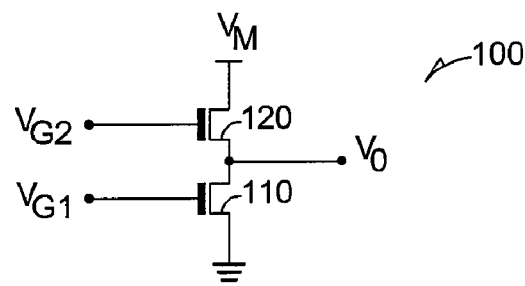
FIG. 1 is a circuit diagram depicting an example embodiment of a scheme for preventing snap-back current.

FIG. 1 is a circuit diagram 100 depicting an example embodiment of a scheme for preventing snap-back current. The shown circuit includes a first NMOS transistor (e.g., transistor 110) and a second NMOS transistor (e.g., transistor 120) connected in series between a high voltage node (e.g., $V_M$) and ground. Each of the transistors 110, 120 may have an associated parasitic bipolar transistor as shown in FIG. 2 and discussed below.

In the absence of the transistor 120, if transistor 110 was directly connected to the high-voltage node, at a certain value of the high-voltage, depending on the feature size (e.g., approximately 16 volts, for a feature size of approximately 250 nanometer (nm)), and the voltage connected to the $V_{G1}$ node, a breakdown may occur at the gate-drain junction of the transistor resulting in a snap-back current (discussed below) flowing through drain-source nodes of the transistor. However, connecting the transistor 120 in series with the transistor 110 and coupling the gate node of the transistor 120 to $V_M$ may prevent the snap-back current form forming in transistor 120 and reduce the chance of snap-back current in transistor 110.

Figure 2:
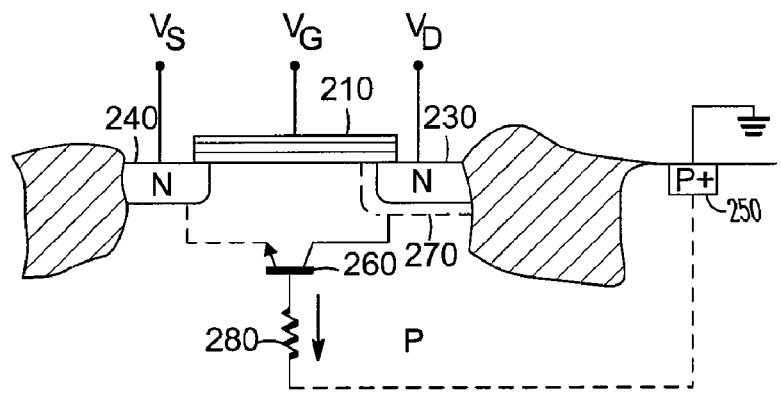
FIG. 2 illustrates an example embodiment of a structure of an NMOS transistor having an associated parasitic bipolar transistor.

To understand the formation of snap-back current, a cross-sectional view 200 of the structure of an NMOS transistor having an associated parasitic bipolar transistor 260 is shown (see FIG. 2). The associated parasitic bipolar transistor 260 is an n-p-n transistor formed by the drain 230, the p-type material of a p-well region (accessed by the $P_+$ region 250) and the source 240 of the NMOS transistor. A resistor 280 may represent a parasitic resistance associated with the p-well region.

In normal operation of the NMOS transistor, the associated parasitic bipolar transistor 260 is OFF and thus plays no role in the transistor operation. When the NMOS transistor is turned off by setting $V_G$ to zero, a voltage drop of $V_M$ at the gate-drain junction induces a depletion region at this junction. Increasing $V_M$ to a certain value (e.g., the breakdown voltage of the junction) may initiate an avalanche breakdown resulting in a release of positive charges that, when passing through the parasitic resistor 280, may raise the potential at the base of the associated parasitic bipolar transistor 260. Such a rise of the base potential of the associated parasitic bipolar transistor 260 to and beyond a certain threshold level may cause the base-emitter junction (e.g., the junction between the p-well and the source 240) of the associated parasitic bipolar transistor 260 to conduct, thereby, turning on the associated parasitic bipolar transistor 260 and leading to a leakage current (e.g., the snap-back current) between the drain and the source of the NMOS transistor.

Figure 3:
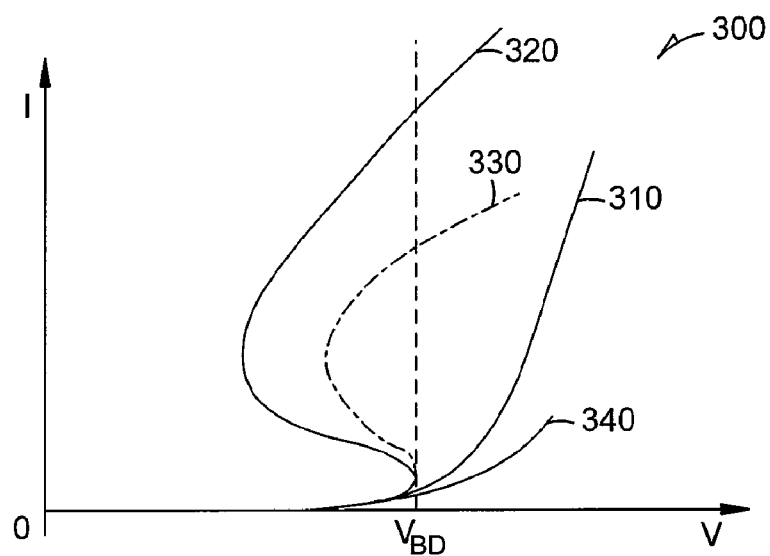
FIG. 3 illustrates an example I-V characteristic for an NMOS transistor, showing snap-back current.

FIG. 3 illustrates an example I-V characteristic 300 for an NMOS transistor such as the NMOS transistor of FIG. 2, showing snap-back current. The I-V characteristic 300 includes curves 310, 320, 330 and 340. The curve 310 may represent a normal revered-biased p-n junction (e.g., gate-drain junction in the NMOS transistor). The curve 320 shows the snap-back behavior, as a result of the leakage through the associated parasitic bipolar transistor 260, when the gate voltage $V_G$ of the NMOS is set to zero and the voltage $V_M$ applied to the drain of NMOS transistor is higher than breakdown voltage ($V_{BD}$). The snap back current shown by curve 330 indicates a less severe situation when the gate voltage is increased to a higher level (e.g., 5 volts). When the $V_G$ voltage is connected to the $V_M$, as shown by curve 340, the snap-back current may be completely eliminated.

Based on the discussion above, connecting the $V_{G2}$ node of the transistor 120 (see FIG. 1) to $V_M$ may keep transistor 120 free from snap-back leakage. However, the situation of transistor 110 (120 (see FIG. 1) may be somewhat different. The potential at the drain of transistor 120, when $V_{G2}$ is coupled to $V_M$, may only rise to a maximum value (worst case) of $V_M$-$V_T$, where $V_T$ represents the threshold voltage of the transistor 120 (typically on the order of 1 volt). This voltage may be less than the breakdown voltage $V_{BD}$ of the NMOS transistor and prevent the snap back in transistor 110 (see FIG. 1).

The snap-back current may reduce the voltage delivered to a load drastically. It may also damage the devices in its path and cause reliability issues. Therefore, as an additional measure to secure the transistor 110 (see FIG. 1) from falling to snap back may be warranted even with a drain node voltage of $V_M$-$V_T$. As seen from FIG. 2, one way to prevent the parasitic bipolar transistor 260 from turning on is to raise the potential at the source node 240 of the NMOS transistor. Raising the potential at the source node 240 may prevent the base-emitter junction of the associated parasitic bipolar transistor 260 from conducting and may keep the associated parasitic bipolar transistor 260 in an OFF state, even when the NMOS transistor (e.g., the transistor 110 of FIG. 1) enters an OFF state (e.g., as $V_{G1}$ (see FIG. 1) is set to zero).

Figure 4:
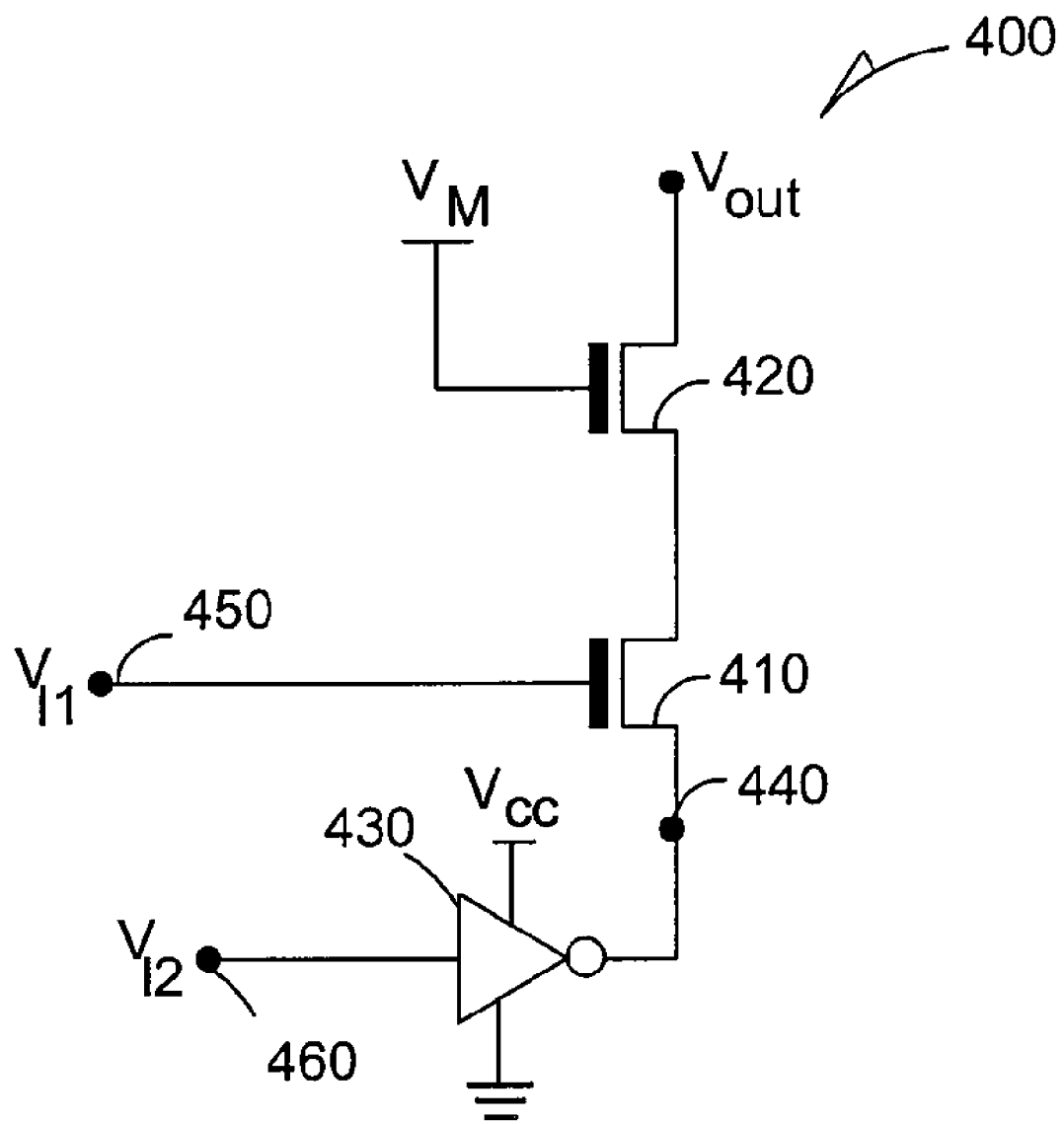
FIG. 4 is a circuit diagram depicting an example embodiment of a scheme for preventing snap-back current in an NMOS transistor.

In an example embodiment, the potential at the source 240 may be raised to the potential of the supply voltage $V_{CC}$ (e.g., 3 or 5 volts). For example, in a circuit 400 shown in FIG. 4, the snap-back current is prevented in both transistors 420 and 410. As discussed above in reference to transistor 120, transistor 420 has no snap-back current because the gate of the transistor 420 is coupled to $V_M$ (see discussion of FIG. 3 above). For the transistor 410, lowering of the drain voltage (e.g., to a worst case value of $V_M$-$V_T$) and at the same time raising the potential of the source node may secure the transistor 410 from snap-back current. Raising the potential of the source node of the transistor 410, when the transistor 410 is turned off by the input voltage $V_{I1}$, (e.g., when the voltage $V_{I1}$ is at zero volts) may be achieved by connecting an auxiliary circuit (e.g., an inverter 430) between a node 460 and drain nodes of transistor 410. A logic circuit may control the voltage $V_{I2}$ at node 460 to vary between $V_{CC}$ and 0 volt, as the input voltage $V_{I1}$ varies between 0 volt and $V_M$. Therefore, the inverter sets the source node 440 of the transistor 410 at $V_{CC}$, when the gate node 450 of the transistor 410 is connected to ground (e.g., zero volts) through the input voltage $V_I$. The inverter 430 is powered by the supply voltage $V_{CC}$, as shown in FIG. 4.

Some example embodiments may include auxiliary circuits that employ the techniques described above to make them snap-back tolerant. Such auxiliary circuits may use bias voltages greater than $V_{CC}$ (e.g., approximately 10 volts, when the $V_M$ is approximately 16 volts). This may further assure the prevention of formation of the snap-back current in transistor 410.

Figure 5:
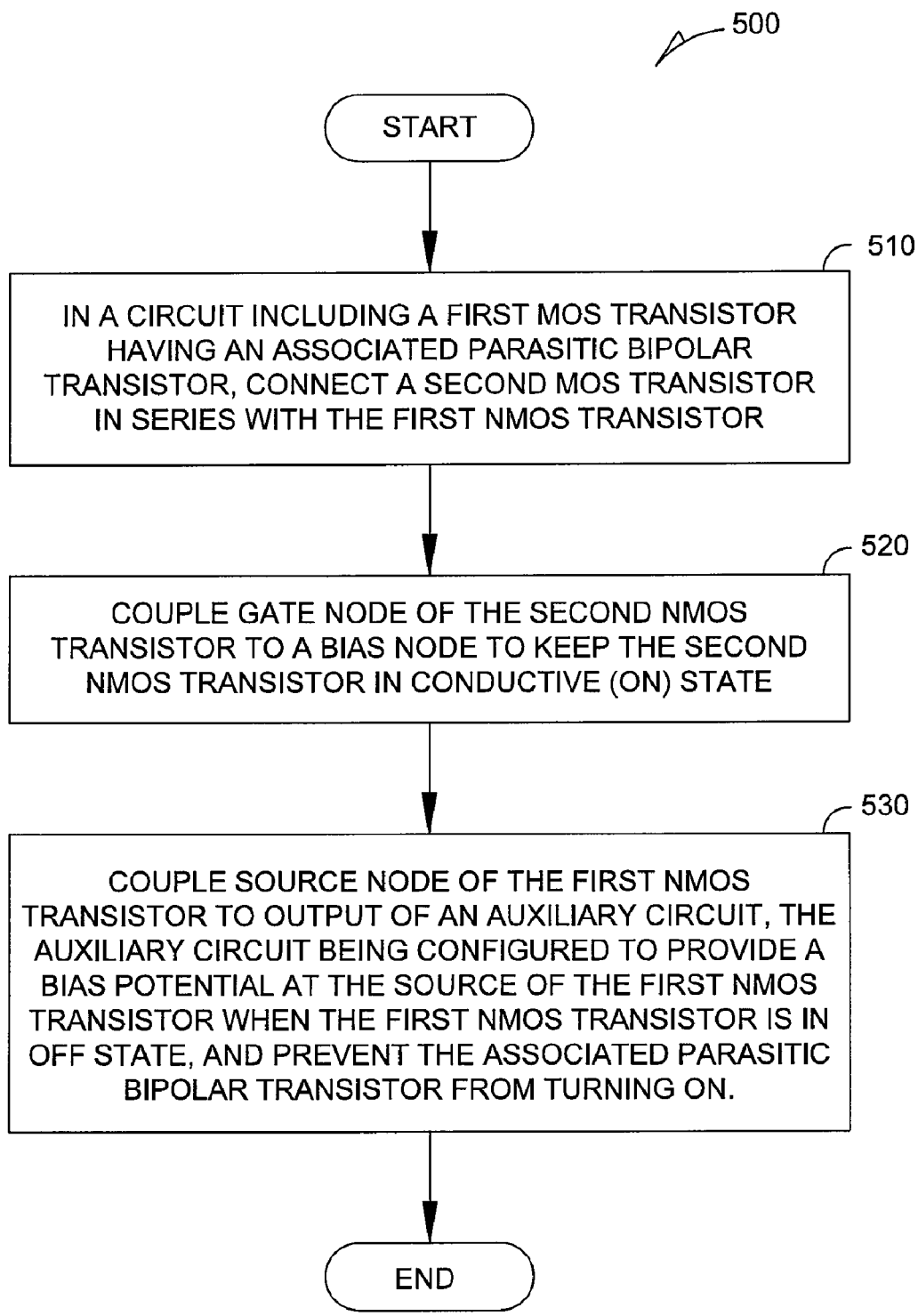
FIG. 5 is a high-level flow diagram illustrating an example embodiment of a method for preventing snap-back current in circuits including NMOS transistors.

FIG. 5 is a high-level flow diagram illustrating an example embodiment of a method 500 for preventing snap-back current in circuits including NMOS transistors. The method 500 relates to a circuit including a first NMOS transistor (e.g., transistor 110 in FIG. 1 or transistor 410 in FIG. 4) having an associated parasitic bipolar transistor (e.g., associated parasitic bipolar transistor 260 in FIG. 2). At operation 510 a second NMOS transistor (e.g., transistor 120 in FIG. 1 or transistor 420 in FIG. 4) may be connected in series with the first NMOS transistor (e.g., between the first NMOS transistor and $V_M$ in FIG. 1 or $V_{out}$ in FIG. 4).

The gate node of the second NMOS transistor may be connected to a bias node to keep the second NMOS transistor free from snap-back current (operation 520). As discussed above and shown in FIG. 4, the gate node of the second NMOS transistor is connected to VM, such that the second NMOS transistor is in conductive (ON) state. At operation 530, the source node of the first NMOS transistor may be coupled to an auxiliary circuit (e.g., the inverter 430 in FIG. 4).

The auxiliary circuit may be configured to provide a bias potential at the source of the first NMOS transistor when the first NMOS transistor is in an OFF state. For example, in the case when a low input (e.g., $V_{I1}$=0) turns the first NMOS transistor OFF, an inverter 430 is connected between the node 460 with a voltage $V_{I2}$ and source node of the NMOS to provide high voltage (e.g., $V_{CC}$) and bias the source node with $V_{CC}$ to further prevent the associated parasitic bipolar transistor from turning on (as discussed above) and consequently prevent the snap-back current in the NMOS transistor.

Figure 6:
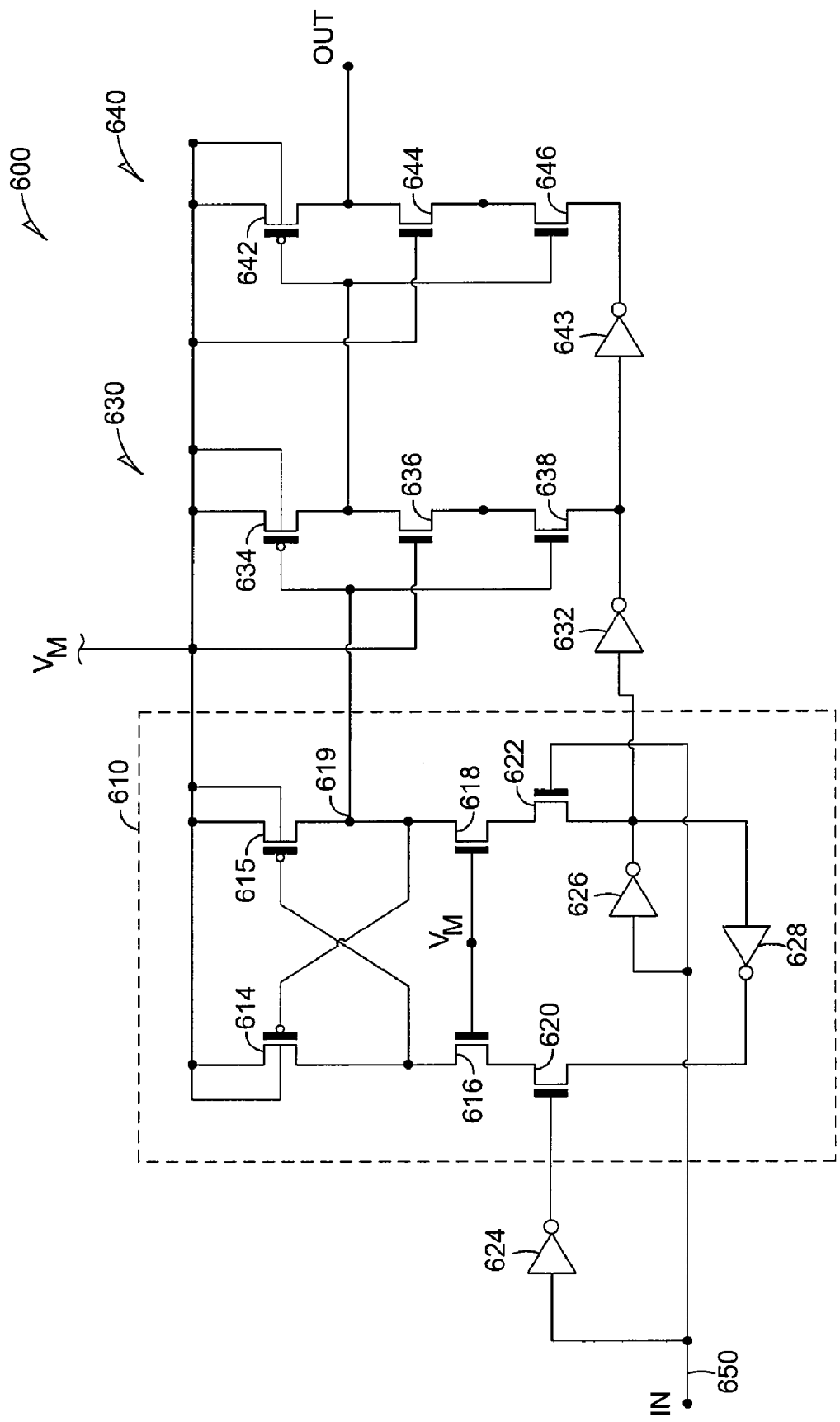
FIG. 6 is a circuit diagram illustrating an example embodiment of a driver circuit including series NMOS transistors and auxiliary circuits for preventing snap-back current.

FIG. 6 is a circuit diagram illustrating an example embodiment of a driver circuit 600 including series NMOS transistors and auxiliary circuits for preventing snap-back current. The driver circuit 600 includes a level shifter 610 and two CMOS inverter stages 630 and 640. The level shifter 610 operates to provide the voltage $V_M$ at an output node 619 of the level shifter 610, when an input at node 650 is low (e.g., at zero o volt). The level shifter 610 includes the series connected NMOS transistors 616 and 618 (with transistors 620 and 622, respectively), having their gate nodes connected to $V_M$, and auxiliary circuits (e.g., inverters) 624, 626, and 628, which, as discussed above, may prevent snap-back current in NMOS transistors 620 and 622 respectively.

The operation of the level shifter 610 is briefly discussed here. When the input at node 650 is zero volts, the gate nodes of transistors 620 and 622 are respectively at $V_{CC}$ and zero, due to operation of the inverter 624. Meanwhile, the source nodes of the transistors 620 and 622 are biased at zero and $V_{CC}$, due to operation of auxiliary circuits 626 and 628, respectively. Therefore, transistors 620 and 622 are ON and OFF, respectively, resulting in a low voltage (approximately zero volts) at the gate node of the PMOS transistor 615 which turns the PMOS transistor 615 into conducting state, resulting in providing $V_M$ at the output node 619 of the level shifter 610.

Since transistor 622 is OFF, in the absence of the series connected NMOS transistor 618 and the auxiliary circuits 624, 626, and 628, the snap-back current in transistor 622 would not allow the voltage $V_M$ to be provided at the output node 619 of the level shifter 610. However, the use of the series connected NMOS transistor 618 and the auxiliary circuits 626 and 628 as discussed above, may prevent the snap-back current in transistor 622. The CMOS inverter stages 630 and 640 are common inverters, except for the series connected transistors 636 and 644 and the auxiliary circuit (e.g., inverter) 643. In the CMOS inverter stages 630 and 640 the gate nodes of the series connected NMOS transistors 636 and 644 are coupled to $V_M$, and proper biases at the source nodes of the transistors 638 and 646 provided by the inverter 643 (e.g., $V_{CC}$ when one of the transistors 638 and 646 are OFF)

may prevent the formation of snap-back current in transistors 638 and 646, when any of the transistors 638 and 646 is in OFF state.

In example embodiments, the PMOS transistors 614, 615, 634, and 642 may also be protected against snap-back current using a technique similar to the technique discussed above with respect to NMOS transistors 636 and 644. Also, the auxiliary circuits that employ the techniques described above may be used to make them snap-back tolerant. Such auxiliary circuits may use bias voltages greater than $V_{CC}$ (e.g. approximately 10 volts, when the $V_M$ is approximately 16 volts). This may further assure the prevention of the formation of snap-back current in transistors 620, 622, 638, and 646.

Figure 7:
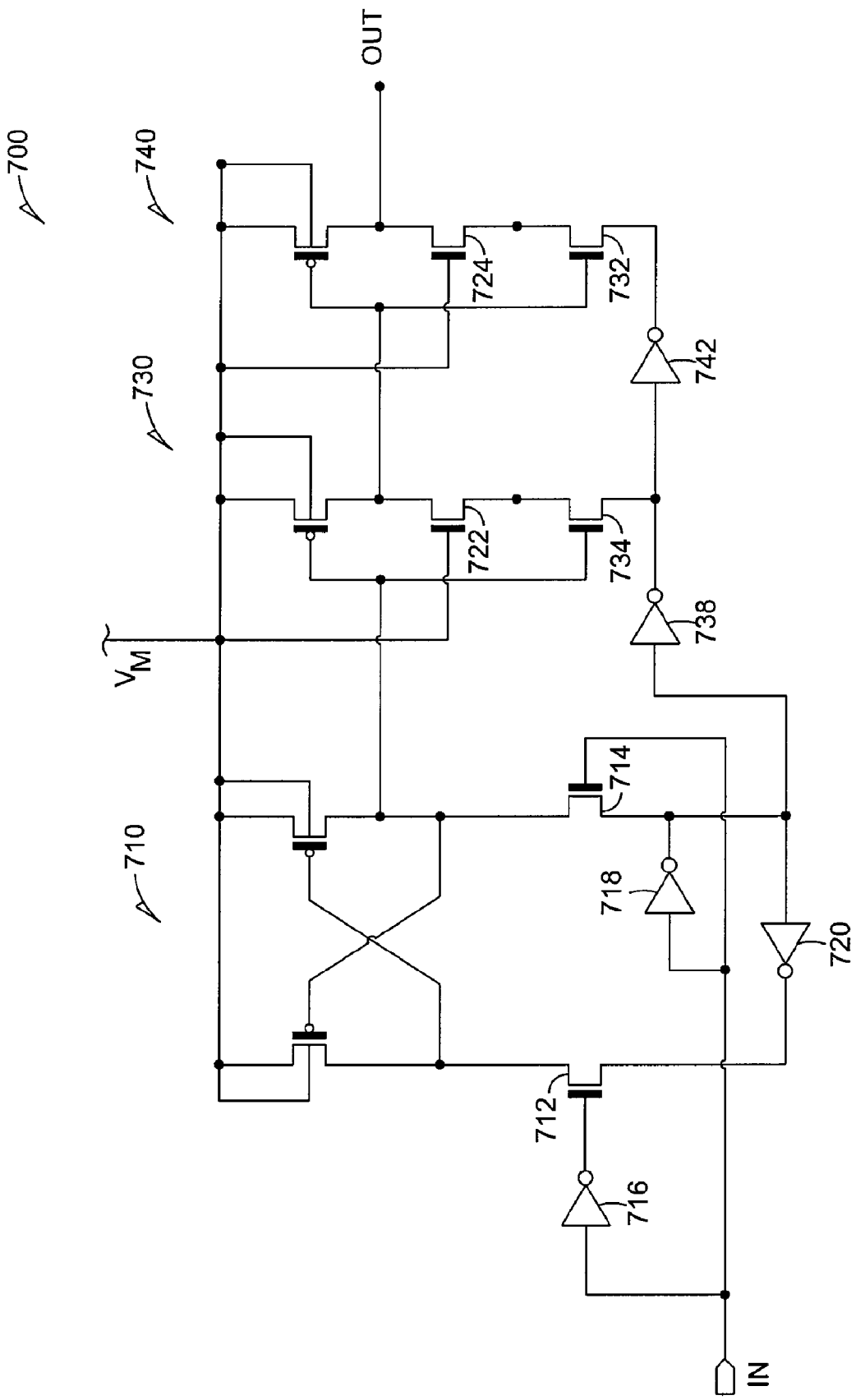
FIG. 7 is a circuit diagram illustrating another example embodiment of a driver circuit including series NMOS transistors and auxiliary circuits for preventing snap-back current.

FIG. 7 is a circuit diagram illustrating another example embodiment of a driver circuit 700 including series NMOS transistors and auxiliary circuits for preventing snap-back current. In the driver circuit 700, the level shifter 710 portion is protected against the snap-back current by relying on the auxiliary circuits (e.g., inverters) 716, 720, and 718 to couple the source node of one of the NMOS transistors 712 and 714 to $V_{CC}$, when that NMOS transistor is in an OFF state. The protection scheme of CMOS inverter stages 730 and 740 against snap-back current is similar to the protection scheme of CMOS inverter stages 630 and 640 in FIG. 6. The series connected NMOS transistors 722 and 724, and the auxiliary circuits (e.g., inverters) 738 and 742 are used to protect the transistors 732 and 734 against snap-back current formation.

Figure 8:
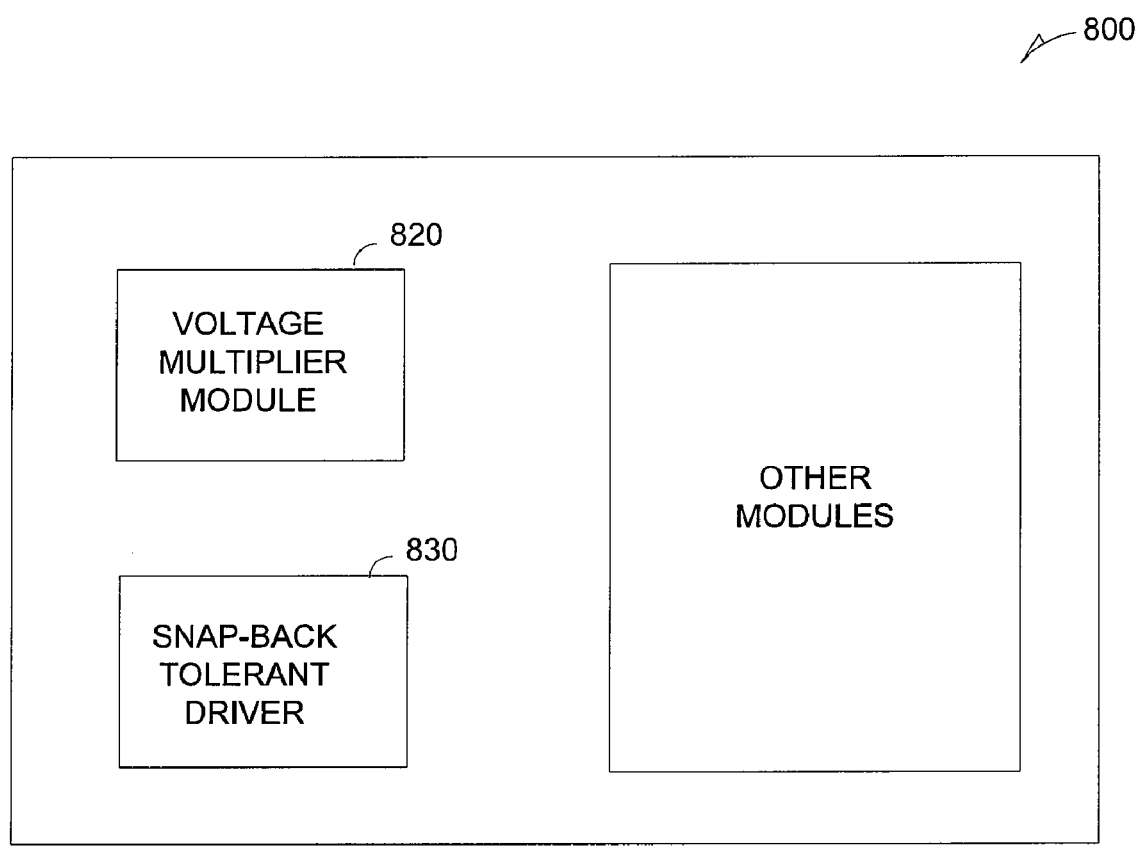
FIG. 8 is a block diagram illustrating an example embodiment of a memory device including a snap-back tolerant driver.

FIG. 8 is a block diagram illustrating an example embodiment of a memory device 800 including a snap-back tolerant driver. The memory device 800 may include a voltage multiplier module 820 to provide high voltage (e.g., 16-20 volts) used for programming the memory device 800. The high-voltage output of the voltage multiplier module 820 may be switched by the snap-back tolerant driver 830. The snap-back tolerant driver 830 may include one or more level shifter circuits and a number of inverter circuits (e.g., level shifter 610 and inverter stages 630 or 640 in FIG. 6). The level shifter and inverter circuits may employ the technology described above (e.g., proper series NMOS transistors and auxiliary circuits as described above) to prevent snap-back current. Other modules of the memory device may also use the technology to protect devices from snap-back current hazards.

A method and a circuit for preventing snap-back current in NMOS transistors of MOS integrated circuits have been described. Although the present embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b). The abstract will allow the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with claims standing on their own as a separate embodiments.

What is claimed is:

1. A method for preventing snap-back current in a circuit including a first N-channel MOS (NMOS) transistor having an associated parasitic bipolar transistor, the method comprising:

connecting a second NMOS transistor in series with the first NMOS transistor;

coupling a gate node of the second NMOS transistor to a bias node, such that the second NMOS transistor is in a continuous conductive state; and coupling a source node of the first NMOS transistor to an output node of an auxiliary circuit, the auxiliary circuit being configured to provide a bias potential at the source of the first NMOS transistor when the first NMOS transistor is in a non-conducting state (OFF), and to provide a zero potential at the source of the first NMOS transistor when the first NMOS transistor is in a conducting state, wherein a combination of the second NMOS transistor in the continuous conductive state and the bias potential at the source of the first NMOS transistor when the first NMOS transistor is in a non-conducting state prevents the associated parasitic bipolar transistor from turning on.

2. The method of claim 1, wherein connecting the second NMOS transistor in series with the first NMOS transistor includes coupling a drain node of the first NMOS transistor to a source node of the second NMOS transistor.

3. The method of claim 2, wherein the drain node of the second NMOS transistor forms an output node of the circuit.

4. The method of claim 1, wherein coupling the gate node of the second NMOS transistor to the bias node includes connecting the bias node to a highest-voltage node of the circuit.

5. The method of claim 1, wherein the auxiliary circuit is configured to provide a positive bias potential at the source node of the first NMOS transistor.

6. A snap-back tolerant circuit comprising:

a first NMOS transistor having an associated parasitic bipolar transistor, a source node of the first NMOS transistor being coupled to an output node of an auxiliary circuit, the auxiliary circuit being configured to provide a bias potential at the source node of the first NMOS transistor when the first NMOS transistor is in a non-conducting state (OFF), and to provide a zero potential at the source of the first NMOS transistor when the first NMOS transistor is in a conducting state;

a second NMOS transistor connected in series with the first NMOS transistor, a source node of the second NMOS transistor being coupled to a drain node of the first NMOS transistor, a gate node of the second NMOS transistor being coupled to a bias node, such that the second NMOS transistor is in a continuous conductive state, wherein a combination of the second NMOS transistor in the continuous conductive state and the bias potential at the source of the first NMOS transistor when the first NMOS transistor is in a non-conducting state prevents the associated parasitic bipolar transistor from turning on.

7. The circuit of claim 6, wherein a drain node of the second NMOS transistor forms an output node of the snap-back tolerant circuit.

8. The circuit of claim 6, wherein the bias node is connected to a highest voltage node of the circuit.

9. The circuit of claim 6, wherein the auxiliary circuit is configured to provide a positive bias potential at the source node of the first NMOS transistor.

10. A snap-back tolerant driver comprising:

a level shifter circuit configured to provide a high voltage at an output node; and an inverter circuit having an input node coupled to the output node, at least one of the level shifter circuit and the inverter circuit including:
  a first NMOS transistor having an associated parasitic bipolar transistor, a source node of the first NMOS transistor being coupled to an output node of an auxiliary circuit, the auxiliary circuit being configured to provide a bias potential at the source node of the first NMOS transistor when the first NMOS transistor is in a non-conducting state (OFF), the bias potential preventing the associated parasitic bipolar transistor from turning on; and
  a second NMOS transistor in series with the first NMOS transistor, a source node of the second NMOS transistor being coupled to a drain node of the first NMOS transistor, a gate node of the second NMOS transistor being coupled to a bias node, such the second NMOS transistor is conductive.

11. The snap-back tolerant driver of claim 10, wherein the bias node is connected to a highest-voltage node of the circuit.

12. The snap-back tolerant driver of claim 10, wherein a drain node of the second NMOS transistor forms an output of the at least one of the level shifter circuit and the inverter circuit.

13. The snap-back tolerant driver of claim 10, wherein the auxiliary circuit is configured to provide a positive bias potential at the source node of the first NMOS transistor.

14. A memory device comprising:
a high voltage multiplier module;
a level shifter circuit configured to provide a high voltage at an output node; and
an inverter circuit having an input node coupled to the output node, at least one of the level shifter circuit and the inverter circuits including:
  a first NMOS transistor having an associated parasitic bipolar transistor, a source node of the first NMOS transistor being coupled to an output node of an auxiliary circuit, the auxiliary circuit being configured to provide a bias potential at the source node of the first NMOS transistor when the first NMOS transistor is in a non-conducting state (OFF), the bias potential preventing the associated parasitic bipolar transistor from turning on; and
  a second NMOS transistor in series with the first NMOS transistor, a drain node of the second NMOS transistor being coupled to an output node and a source node of the second NMOS transistor being coupled to a drain node of the first NMOS transistor, a gate node of the second NMOS transistor being coupled to a bias node, such that that the second NMOS transistor is in conductive (ON) state.

* * * * *

UNITED STATES PATENT AND TRADEMARK OFFICE
CERTIFICATE OF CORRECTION

PATENT NO. : 8,085,604 B2  
APPLICATION NO. : 12/334155  
DATED : December 27, 2011  
INVENTOR(S) : Philip S. Ng Page 1 of 1

It is certified that error appears in the above-identified patent and that said Letters Patent is hereby corrected as shown below:

Column 6, line 41, claim 6, after "state;" please insert --and--.

Column 7, line 17, claim 10, after "such" please insert --that--.

Column 8, line 23, claim 14, please delete "that" second occurrence.

Signed and Sealed this
Twenty-eighth Day of February, 2012

David J. Kappos
*Director of the United States Patent and Trademark Office*